United States Patent
De Fleury et al.

(10) Patent No.: US 6,522,127 B1
(45) Date of Patent: Feb. 18, 2003

(54) DEVICE FOR MEASURING A PHYSICAL QUANTITY ASSOCIATED WITH THE ROTATION OF A MEMBER

(75) Inventors: Bernard Auge De Fleury, Noisy le Grand (FR); Jean Yves Zliechovec, Seugy (FR); Jean-Claude Bouttemy, Issy les Moulineaux (FR)

(73) Assignee: Alstom France S.A., Paris (FR)

( * ) Notice: Subject to any disclaimer, the term of this patent is extended or adjusted under 35 U.S.C. 154(b) by 0 days.

(21) Appl. No.: 09/312,889

(22) Filed: May 17, 1999

(30) Foreign Application Priority Data

May 18, 1998 (FR) .............................. 98 06257
Jun. 9, 1998 (FR) .............................. 98 07246

(51) Int. Cl.[7] .............................. G01B 7/30; G01P 3/42
(52) U.S. Cl. .............. 324/207.16; 324/173; 324/207.25
(58) Field of Search .................. 324/207.16, 174, 324/207.12, 236, 217, 173, 178, 179, 207.25; 105/199, 199.5; 280/407.1

(56) References Cited

U.S. PATENT DOCUMENTS 5,289,120 A    2/1994   Moretti et al.
5,509,262 A *  4/1996   Stahlecker ................... 57/264

FOREIGN PATENT DOCUMENTS

| DE | 33 11 781 | 10/1984 |
|----|-----------|---------|
| DE | 35 05 765 | 8/1986  |
| DE | 43 13 753 | 11/1994 |
| JP | 01 175140 | 7/1989  |

* cited by examiner

*Primary Examiner*—Jay Patidar
(74) *Attorney, Agent, or Firm*—Young & Thompson

(57) ABSTRACT

The device for measuring a physical quantity associated with the rotation of a member includes a metal disc, integral with the rotating member, provided with at least one aperture forming a reference point. In addition, this device includes a fixed assembly for detecting the reference point, with at least one magnetic proximity detector and a part for checking that this detector is operating correctly, this being fixed outside the magnetic detector, without electrical contact or connection with the latter. The checking part has at least one conducting turn which surrounds an active end of the detector and is connected to modify its state by short-circuiting this turn or by supplying it with current.

12 Claims, 5 Drawing Sheets

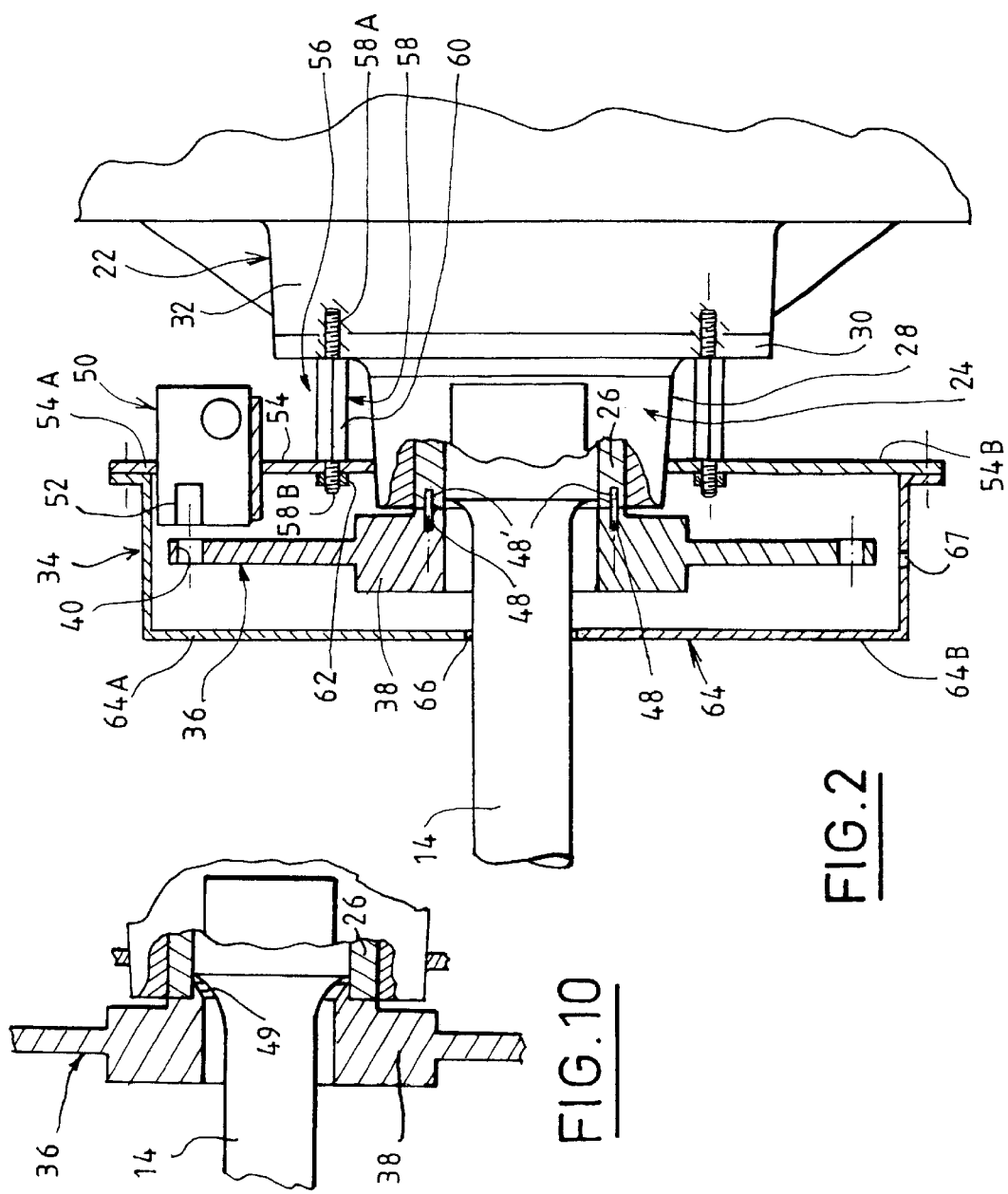

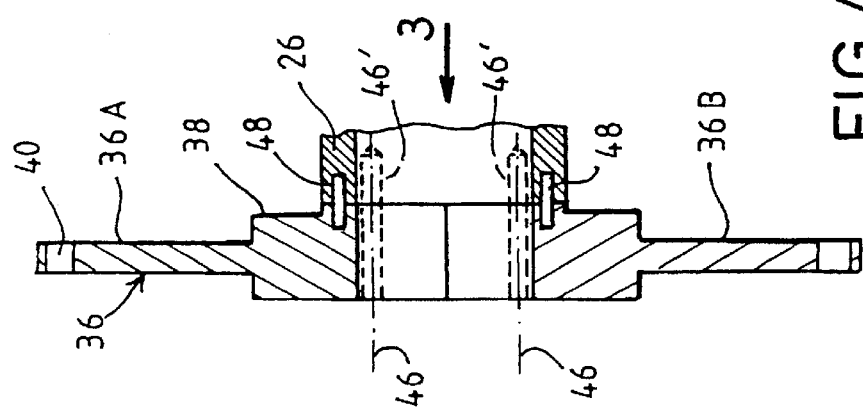
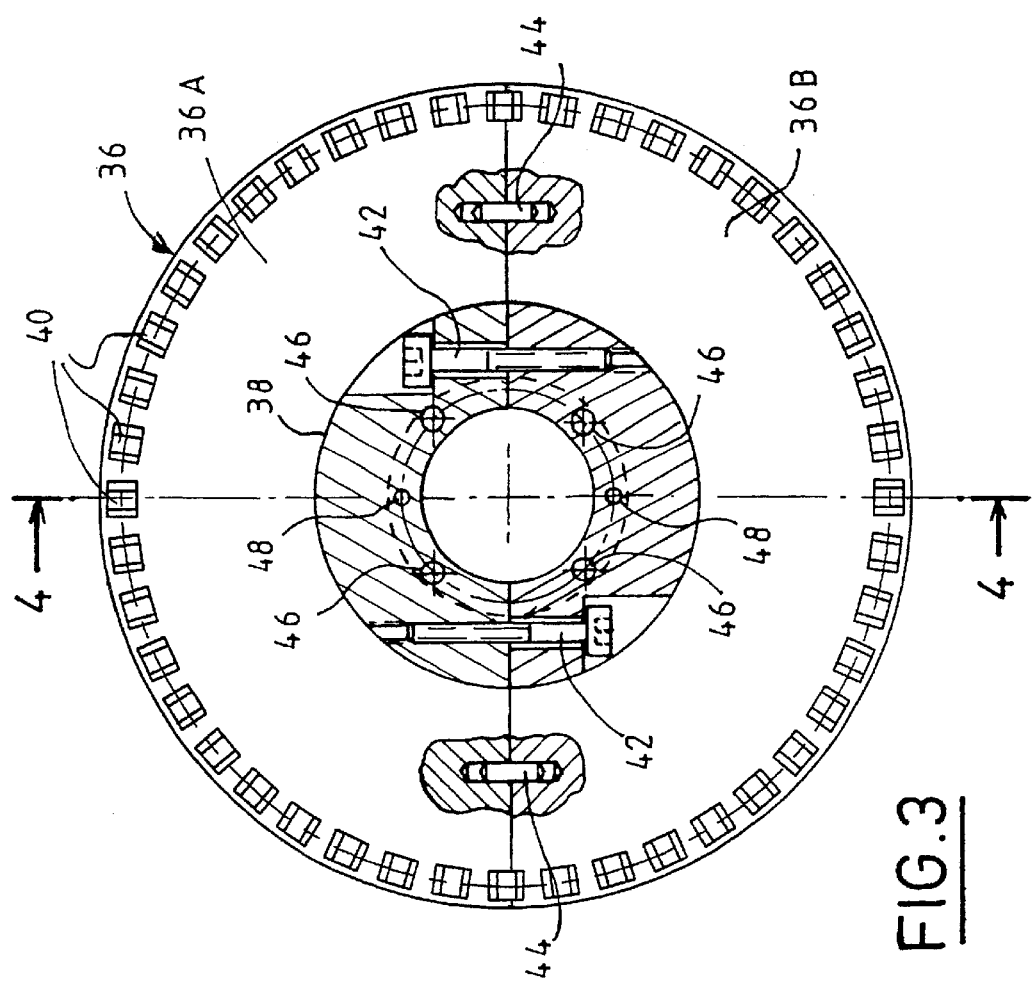

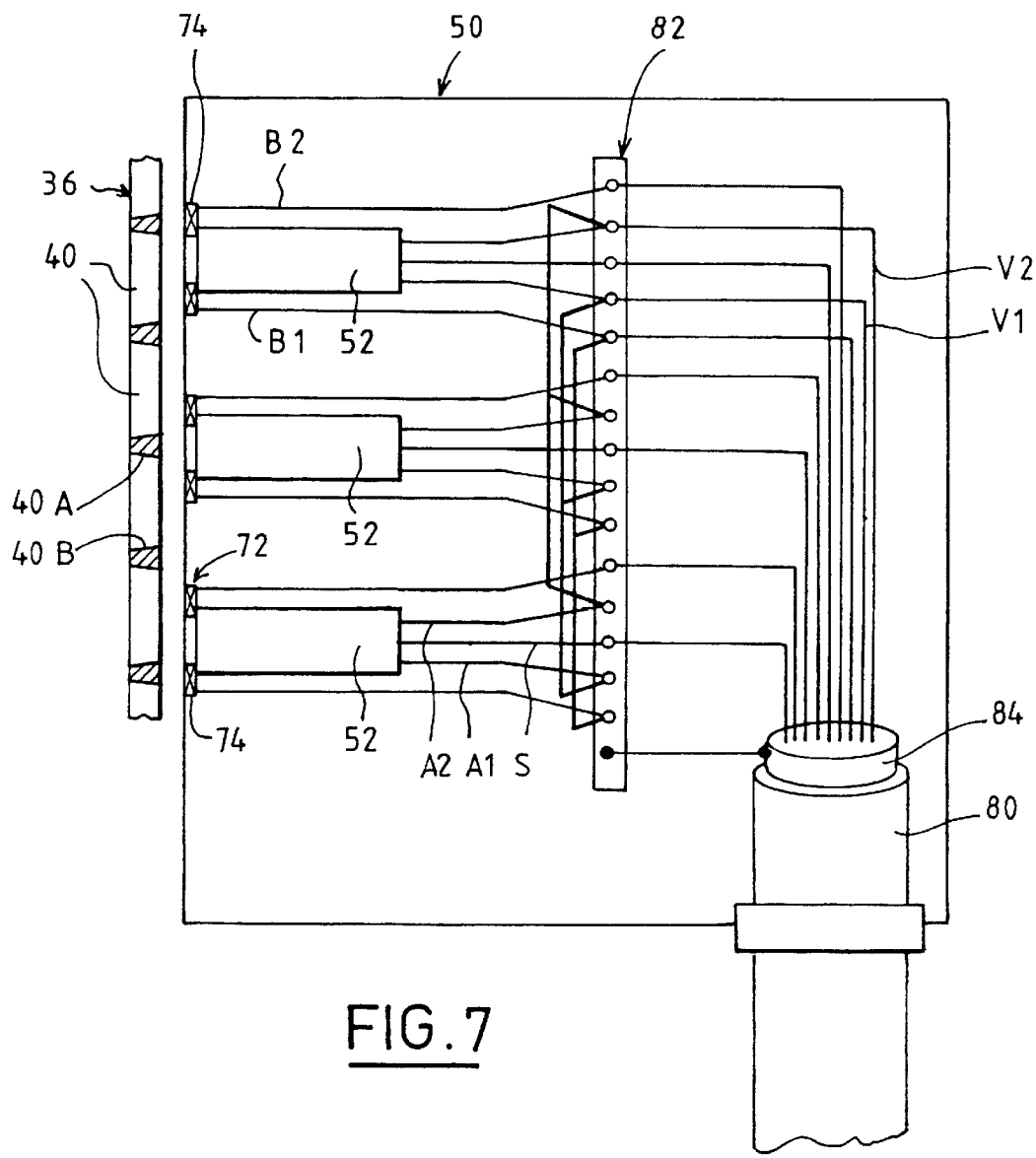
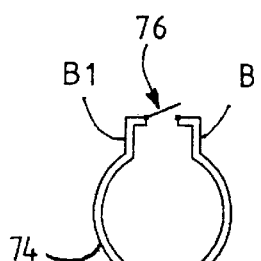
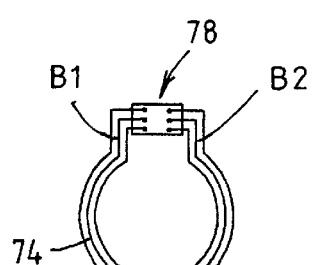
FIG. 7
FIG. 8    FIG. 9

US 6,522,127 B1

DEVICE FOR MEASURING A PHYSICAL QUANTITY ASSOCIATED WITH THE ROTATION OF A MEMBER

BACKGROUND OF THE INVENTION

The present invention relates to a device for measuring a physical quantity associated with the rotation of a member and to methods for checking this device.

It applies in particular to the measurement of a physical quantity associated with the rotation of a bogie axle of a railway vehicle.

DESCRIPTION OF THE RELATED ART

In the prior art, a device is already known for measuring a physical quantity associated with the rotation of a member, which comprises a metal disc integral with the rotating member and provided with at least one aperture forming a reference point.

In the case of a bogie of a railway vehicle, the disc is integral with one axle (rotating member).

Conventionally, the measurement device delivers a physical quantity associated with the angular displacement of the disc, which makes it possible to calculate in particular the distance travelled by the railway vehicle or else the speed of this vehicle.

Usually, the measurement device includes an optical detection assembly and is in the form of a preassembled module intended to be mounted on a free end of a bogie axle. The optical detection assembly and the disc are protected from dust and dirt by suitable sealing means. Such a preassembled module may advantageously be fitted onto a bogie without dismantling the latter.

In some cases, mounting the preassembled module on the free end of a bogie axle is prevented or impossible. However, it is difficult to adapt such a module in order to allow it to be fitted onto another part of the axle, this being in particular for reasons of difficult mounting, of lack of space and/or of protection against water, dust and dirt which are liable to interfere with the correct operation of the optical detection assembly.

SUMMARY OF THE INVENTION

The object of the invention is especially to propose a device allowing reliable measurement of a physical quantity associated with the rotation of a bogie axle, this measurement device being moreover easy to fit onto the bogie.

For this purpose, the subject of the invention is a measurement device of the aforementioned type, characterized in that it comprises a fixed assembly for detecting this reference point, comprising at least one magnetic proximity detector and means for checking that this detector is operating correctly, these means being fitted outside the magnetic detector, without electrical contact or connection with the latter.

According to other characteristics of this measurement device:

the checking means comprise at least one conducting turns which surrounds an active end of the detector and is connected to means of modifying its state by short-circuiting this turn or by supplying it with current;
  the checking means comprise a conducting coil, consisting of several turns, which surrounds an active end of the detector and is connected to means of modifying its state by short-circuiting this coil or by supplying it with current;
  the magnetic detector is an inductive proximity detector;
  the disc comprises n apertures uniformly distributed over a circle centred on its axis and the detection assembly comprises p inductive detectors uniformly distributed over a circular arc opposite the apertures, the dimensions and the angular spacings of the apertures and of the detectors being such that there is always a detector opposite an aperture whatever the angular position of the disc with respect to the detection assembly;
  the rotating member is a bogie axle of a railway vehicle.

The subject of the invention is also a method of checking the measurement device defined above, characterized in that the state of the turn or of the oil of the detector in operation is modified according to a reference sequence and this reference sequence is compared with the signal output by this detector.

The subject of the invention is also a method of controlling the measurement device defined above, characterized in that, with the disc being unable to move with respect to the detection assembly, the state of the means of checking at least one detector in operation and opposite an aperture is modified according to a reference sequence and this reference sequence is compared with the signal output by this detector opposite an aperture.

BRIEF DESCRIPTION OF THE DRAWINGS

The invention will be more clearly understood on reading the description which follows, given solely by way of example and with reference to the drawings in which:

FIG. 2 is a sectional view, on a large scale, on the line 2—2 in FIG. 1;

FIG. 3 is a view of the disc of the measurement device, looking in the direction of the arrow 3 in FIG. 4, with partial sections;

FIG. 4 is a view looking in the direction of the arrow 4 in FIG. 3;

FIG. 7 is a diagrammatic view of the detection assembly carried by the bogie;

FIGS. 8 and 9 are diagrammatic views of a turn for checking a detector of the assembly shown in FIG. 7, this turn being connected to means for modifying its state by short-circuiting it and supplying it with current, respectively; and FIG. 10 is a view similar to FIG. 2, showing an alternative embodiment of means for centring the disc with respect to one bogie axle.

DESCRIPTION OF THE PREFERRED EMBODIMENTS

Figure 1:
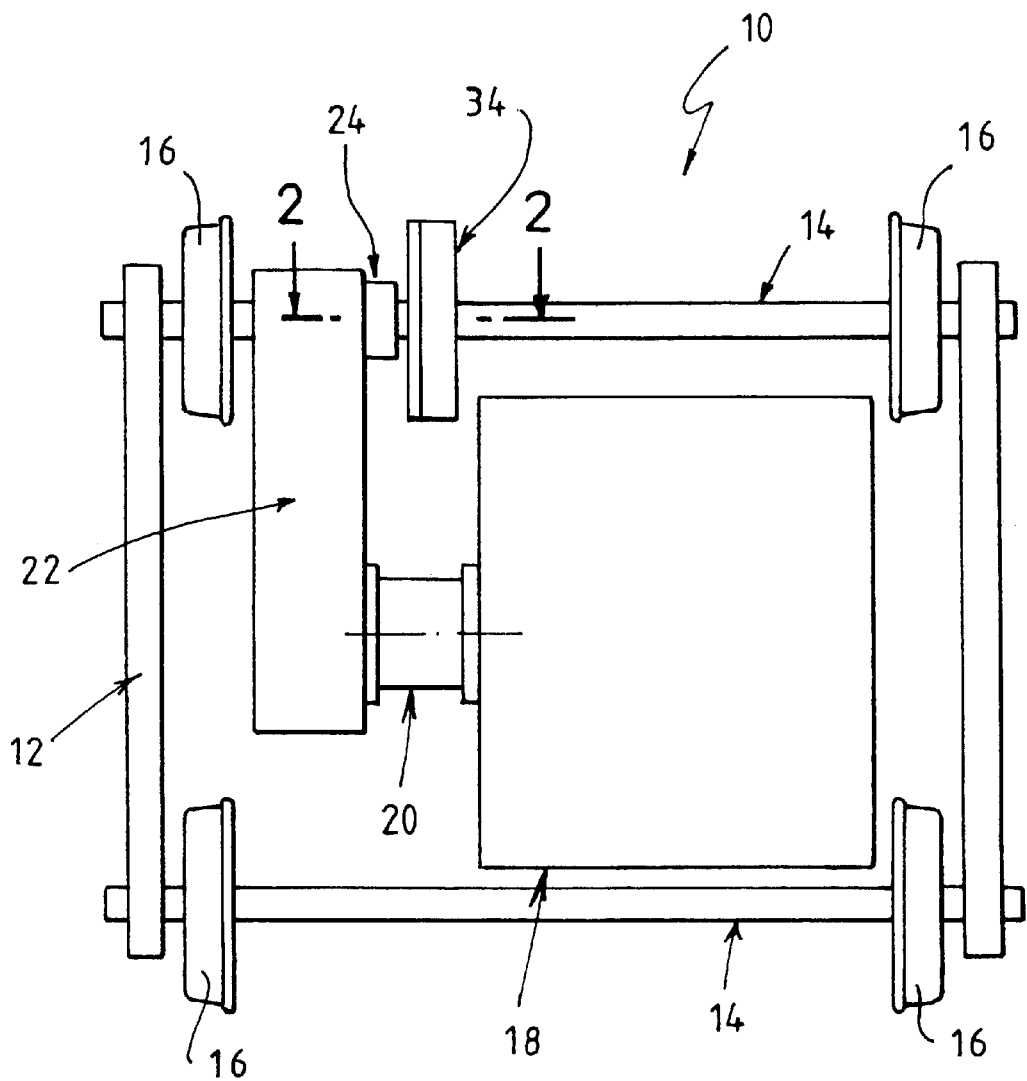
FIG. 1 is a diagrammatic view of a bogie of a railway vehicle carrying a detection assembly according to the invention.

FIG. 1 shows diagrammatically a bogie of a railway vehicle, denoted by the general reference 10.

Conventionally, this bogie has a fixed frame 12 and a pair of axles 14 carrying wheels 16 which are mounted so as to rotate on this frame 12. The bogie 10 also has a conventional electric drive motor 18 connected to one axle 14 via a coupling device 20 and a reduction device 22. The bogie 10 also has a conventional return assembly 24 for the current supplied to the motor 18. This assembly 24 ensures that the current coming from the motor 18 returns to the axle 14 coupled to the reduction device 22, using conventional rubbing-type electrical contact means.

Referring to FIG. 2, this shows that the current return assembly 24 has a slip ring 26 forming a shoulder integral with the axle 14. The current return assembly 24 also has a fixed case 28 surrounding the slip ring 26 and provided with a fastening flange 30. This flange 30 is fastened, by means which will be described later, to a fixed case 32 of the reduction device 22 carried by the frame 12.

In addition, the bogie 10 has a device 34 for measuring a physical quantity associated with the rotation of the axle 14, shown in detail in FIGS. 2 to 4. This measurement device 34 has a metal disc 36 integral with the axle 14 and coaxial with the latter.

The disc 36 has a hub 38 and at least one aperture 40 forming a reference point. Preferably, the disc 36 has n apertures 40 uniformly distributed over a circle centred on its axis, n being a non-zero integer.

The apertures 40 are formed, for example, by holes passing through the thickness of the disc, as is shown especially in FIGS. 2 and 3, or by notches emerging at the periphery of this disc.

In order to allow it to be mounted around the axle 14, the disc 36 has at least two parts 36A, 36B which form two sectors, each preferably extending over approximately 180°, connected together by a pair of bolts 42 and a pair of centring pins 44 approximately parallel to the faces of the disc 36 (see FIG. 3).

The hub 38 of the disc is fastened to a free face of the slip ring 26 by means of bolts 46 (these bolts being shown by broken lines in FIG. 4) and of centring pins 48 approximately perpendicular to the faces of the disc 36 and parallel to the axis of the axle 14 (see especially FIGS. 3 and 4).

In the example illustrated in the figures, the hub 38 of the disc is fixed to the slip ring 26 by means of four bolts 46 and two centring pins 48, namely two bolts 46 and one centring pin 48 per part 36A, 36B of the disc.

As a variant, the centring pins 48 may be replaced by other means of centring with respect to the axle 14, for example a shoulder 49 machined in the hub 38 of the disc, engaging with the internal profile of the slip ring 26, as shown in FIG. 10.

In addition, the measurement device 34 has a fixed assembly 50 for detecting the apertures 40 in the disc 36.

This detection assembly 50, shown in greater detail in FIG. 7, comprises at least one magnetic proximity detector 52, for example three detectors as illustrated, or p detectors, p being a non-zero integer, uniformly distributed over a circular arc opposite the apertures 40.

The detectors 52 are of known type, for example of the inductive type sold by Omrom Electronics under the reference E2EG. These inductive detectors operate using the principle of eddy currents.

The dimensions and angular spacings of the apertures 40 and of the detectors 52 are such that there is always a detector 52 opposite an aperture 40 whatever the angular position of the disc with respect to the detection assembly 50.

Preferably, in order to prevent dust building up in the apertures 40, the latter are each bounded by two approximately radial surfaces 40A, 40B converging on that face of the disc 36 which is opposite the detection assembly 50, as shown in FIG. 7.

The detection assembly 50, which will be described in greater detail later, is carried by a fixed mounting plate 54 (see FIG. 2). The flange 30 of the case 28 of the current return assembly and the mounting plate 54 are connected by at least one common fastening member 56, preferably four of them, to the case 32 of the reduction device. This case 32 therefore forms a support, carried by the frame of the bogie, common to the flange 30 of the current return assembly and to the mounting plate 54.

Each fastening member 56 comprises a stud 58 provided with two threaded ends 58A, 58B and with a polygonal manoeuvring body 60 separating the flange 30 from the mounting plate 54. A first end 58A of the stud, passing through the flange 30 of the case 28, is screwed into the case 32 of the reduction device. The second end 58B of the stud, passing through the mounting plate 54, is screwed into a lock nut 62.

The disc 36 is covered by a protective cover 64 connected to the mounting plate 54 in a manner known per se.

In order to allow the mounting plate 54 and the cover 64 to be mounted around the axle 14, each of them comprises at least two parts 54A, 54B, 64A, 64B forming two sectors preferably extending over approximately 180°.

It will therefore be understood that the mounting plate 54 and the cover 64 form a casing which protects the disc 36 and the detection assembly 50 from the surrounding dust and dirt, as well as from splashes of water under the bogie.

However, the presence of a radial clearance 66 will be noted between the rotating axle 14 and that wall of the cover 64 through which this axle passes. This radial clearance 64 makes it possible to allow for the manufacturing tolerances on the axle 14 and on the cover 64.

The dust and dirt penetrating, as the case may be, the casing formed by the mounting plate 54 and the cover 64 via the clearance 66 are not liable to disrupt the correct operation of the inductive proximity detectors 52 which are much less sensitive to dust and dirt than the optical detectors. Moreover, any water liable to penetrate the casing is automatically removed via a hole 67 drilled in the bottom of the cover 64 (see FIG. 2).

The cover 64 therefore provides sufficient sealing to guarantee correct operation of the inductive proximity detectors 52. It is therefore not necessary to rely on complex and bulky sealing means, such as those usually associated with conventional optical detection assemblies.

A method of machining the means for fastening the disc 36 onto the free face of the slip ring 26 will be described below.

Figure 5:
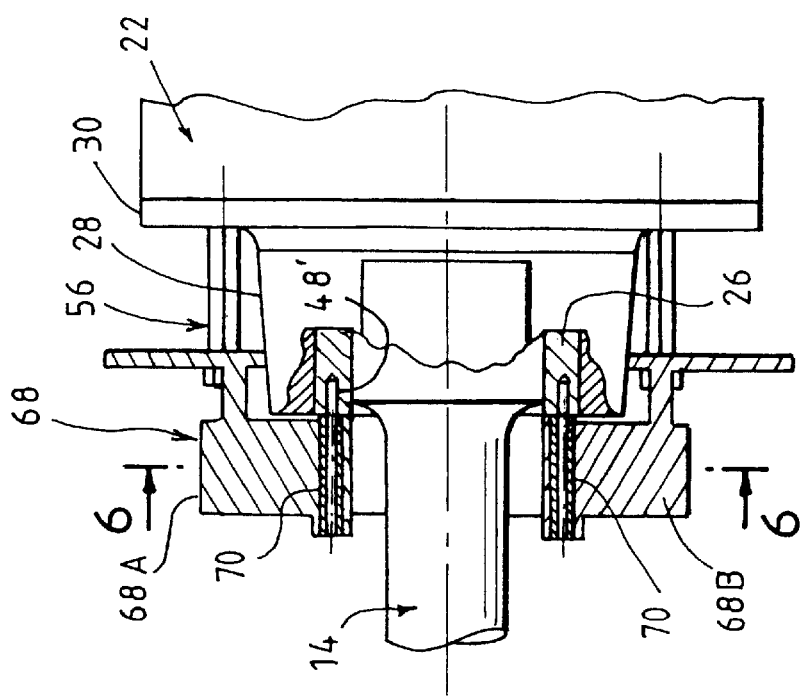
FIG. 5 is a view similar to FIG. 2, in which a guiding tool is fitted instead of the disc.
Figure 6:
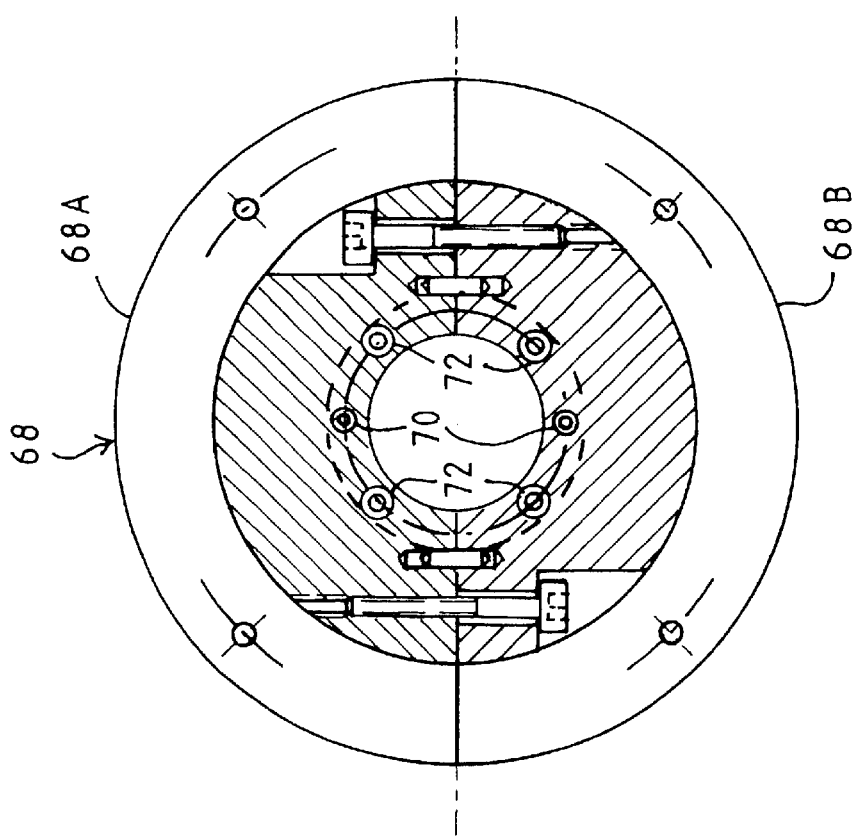
FIG. 6 is a sectional view on the line 6—6 in FIG. 5.

Firstly, a guiding tool 68 of annular general shape is temporarily fixed to the case 22 of the reduction device (see FIGS. 5 and 6) by means of common fastening members 56, instead of the mounting plate 54.

In order to allow it to be mounted around the axle 14, the tool 68 has at least two parts 68A, 68B forming two sectors, each preferably extending over approximately 180°. These two parts 68A, 68B are connected together by means similar to those connecting the two parts 36A, 36B of the disc (see FIG. 6).

The guiding tool 68 is centred with respect to the axis of the axle 14 using conventional means.

After the guiding tool 68 has been fastened and centred, centring holes 48' intended to receive the centring pins 48 of the disc (see FIG. 2) and, if there are not any of them already, tapped holes 46' intended to receive the bolts 46 for fastening the disc (see FIG. 4) are formed, in the free face of the slip ring 26, by means of a conventional drilling tool (not shown) which is guided by drilling bushes 70, 72 carried by the guiding tool 68.

After the centring holes 48' and tapped holes 46' have been drilled, the guiding tool 68 is removed and the disc 36 is fastened onto the free face of the ring 26 using the means described above.

As a variant, in the case in which the free face of the slip ring 26 already has tapped holes, the latter then form the holes 46' and the machining tool 68 may be temporarily fastened to the free face of the ring by means of bolts screwed into these pre-existing tapped holes so as to be able to form the centring holes 48'.

It is therefore apparent from the foregoing, and more particularly from the machining method described above, that the measurement device 34 may be mounted on the bogie 10 without dismantling the latter.

The detection assembly 50 will now be described below in greater detail, with reference to FIGS. 7 to 9.

It will be noted that the detectors 52 described are of the inductive type. However, any type of magnetic detector could be used within the context of the invention, for example Hall-effect detectors.

Conventionally, each inductive detector 52 is electrically connected to two electrical supply conductors A1, A2 and to an output signal conductor S.

Each inductive detector 52 has means 72 for checking that it is operating correctly. The means 72 are fitted outside the inductive detector, without electrical contact or connection with the latter.

Preferably, the checking means 72 comprise at least one conducting turn 74 surrounding an active end of the detector 52. This turn 74 is connected to means of modifying its state. Such state-modifying means consist, for example, of conventional means for short-circuiting the turn 74, comprising, in particular, a switch 76, as illustrated in FIG. 8, or else by conventional means 78 of supplying the turn 74 with current, as illustrated in FIG. 9.

As a variant, the turn 74 may be replaced by a conducting coil consisting of several turns.

Each turn 74 is connected to an input conductor B1 and an output conductor B2.

The set of conductors A1, A2, S, B1, B2 is connected to a multiconductor cable 80 via a terminal strip 82.

It will be noted that the supply conductors A1, A2 for the detectors 52 are connected in parallel to each other and to two supply conductors V1, V2 of the cable 80. It will also be noted that the input conductors B1 for the turns 74 are connected to a common point on the terminal strip 82. Finally, it will be noted that the cable 80 has a screen 84 which is also connected to the terminal strip 82.

Conventionally, each of the inductive detectors 52 has an oscillator (not shown) associated with an electronic detection circuit. The output signal emitted by the detector 52 is of the binary type (a high level and a low level). A metal element (a disc portion separating two apertures 40) passing in front of the detector 52 modifies the state of its oscillator and causes a change in level of the output signal.

When a detector 52 is operating and its active end is away from any perturbing metal element, modifying the state of the turn 74 associated with this detector, by short-circuiting it or by supplying it with current, causes a change in level of the output signal, just as a metal element passing in front of the detector 52 would do.

The checking means 72 therefore make it possible to check the measurement device 34 in the following manner.

When the disc 36 is unable to move with respect to the detection assembly 50, the state of the turn 74 of at least one detector in operation and opposite an aperture 40 is modified according to a reference sequence. It should be recalled that the dimensions and the angular spacings of the apertures 40 and of the detectors 52 are such that there is always a detector opposite an aperture 40 whatever the angular position of the disc 36 with respect to the detection assembly 50.

The reference sequence is compared with the signal output by the checked detector so as to verify that the level of this signal changes according to a sequence identical to the reference sequence. If this is not the case, it may be concluded that there is an operating fault in the detector 52 checked.

It will be noted that the method described above for checking a detector 52 makes it possible to detect any accidental displacement of the disc 36 by the fact that such a displacement causes a disparity between the reference sequence and the change-in-level sequence of the output signal.

Any accidental displacement of a bogie, and therefore of a railway vehicle, during the above method of checking a detector 52 can therefore be easily detected.

The checking means 72, independent of the operation of the detectors 52, therefore allow a very reliable and sure check to be made of the detectors.

What is claimed is:

1. A device for measuring a physical quality associated with the rotation of a member (14), comprising:
   a metal disc (36) integral with the rotating member (14) and provided with a plurality of apertures (40) uniformly distributed over a circle centered on an axis of the rotating member, each of the apertures (40) forming a reference point,
   a fixed assembly (50) for detecting these reference points, comprising
      a plurality of magnetic proximity detectors (52) uniformly distributed over a circular arc opposite the apertures (40), the dimensions and the angular spacings of the apertures (40) and of the detectors (52) being such that there is always a detector (52) opposite an aperture (40) whatever the angular position of the disc (36) with respect to the detection assembly (50), and
      checking means (72) for checking that the detectors (52) are operating correctly, the checking means (72) being fitted outside the magnetic detectors (52), without electrical contact or connection with the detectors (52).

2. The device according to claim 1, wherein the checking means (72) comprise at least one conducting turn (74) which surrounds an active end of one of the detectors (52).

3. The device according to claim 2, wherein the checking means (72) comprise a conducting coil of several turns (74), which surrounds an active end of one of the detectors (52).

4. The device according to claim 1, wherein the checking means (72) comprise at least one conducting turn (74) which surrounds an active end of one of the detectors (52) and is connected to means (78) for supplying this conducting turn (74) with current.

5. The device according to claim 1, wherein the checking means (72) comprise a conducting coil of several turns (74), which surrounds an active end of one of the detectors (52) and is connected to means (78) for supplying this conducting coil with current.

6. The device according to claim 1, wherein the magnetic detector (52) is an inductive proximity detector.

7. The device according to claim 1, wherein the rotating member is a bogie axle (14) of a railway vehicle.

8. A method of checking a measurement device, the measurement device comprising
- a metal disc (36) integral with the rotating member (14) and provided with a plurality of apertures (40) uniformly distributed over a circle centered on an axis of the rotating member, each of the apertures (40) forming a reference point,
- a fixed assembly (50) for detecting these reference points, comprising
  - a plurality of magnetic proximity detectors (52) uniformly distributed over a circular arc opposite the apertures (40), the dimensions and the angular spacings of the apertures (40) and of the detectors (52) being such that there is always a detector (52) opposite an aperture (40) whatever the angular position of the disc (36) with respect to the detection assembly (50), and
  - checking means (72) for checking that the detectors (52) are operating correctly, the checking means (72) being fitted outside the magnetic detectors (52), without electrical contact or connection with the detectors (52),
  - wherein the checking means (72) comprise at least one conducting turn (74) which surrounds an active end of one of the detectors (52),
- with the disc (36) being unable to move with respect to the detection assembly (50), the method comprises the steps of:
  - operating the checking means (72) of a detector opposite an aperture in order to modify the state of the turn (74), and
  - comparing a reference with the signal output by the detector (52) opposite the aperture (40) to make a determination as to proper operation of the detector opposite the aperture.

9. A method of checking a measurement device, according to claim 8, wherein,
- operating the checking means (72) by supplying the turn (74) with current according to a reference sequence, in order to modify the state of the turn (74), and
- comparing the reference sequence with the signal output by the detector (52) opposite the aperture (40).

10. A device for measuring a physical quantity associated with the rotation of a member (14), comprising:
- a metal disc (36) integral with the rotating member (14) and provided with a plurality of apertures (40) uniformly distributed over a circle centered on its axis, each of the apertures (40) forming a reference point,
- a fixed assembly (50) for detecting the reference points, comprising
  - a plurality of magnetic proximity detectors (52) uniformly distributed over a circular arc opposite the apertures (40), the dimensions and the angular spacings of the apertures (40) and of the detectors (52) being such that there is always a detector (52) opposite an aperture (40) whatever the angular position of the disc (36) with respect to the detection assembly (50), and
  - checking means (72) for checking that the detectors (52) are operating correctly, the checking means being fitted outside the magnetic detectors (52) without electrical contact or connection with the detectors (52),
  - the checking means (72) comprising at least one conducting turn (74) surrounding an active end of the detector (52); and
  - means connected to the checking means for changing the state of the turn (74) from a first state to a second state and from the second state to the first state.

11. A device for measuring a physical quantity associated with the rotation of a member (14), comprising:
- a metal disc (36) integral with the rotating member (14) and provided with a plurality of apertures (40) uniformly distributed over a circle centered on its axis, each of the apertures (40) forming a reference point,
- a fixed assembly (50) for detecting these reference points, comprising
  - a plurality of magnetic proximity detectors (52) uniformly distributed over a circular arc opposite the apertures (40), the dimensions and the angular spacings of the apertures (40) and of the detectors (52) being such that there is always a detector (52) opposite an aperture (40) whatever the angular position of the disc (36) with respect to the detection assembly (50), and
  - checking means (72) for checking that the detectors are operating correctly, the checking means being fitted outside the magnetic detectors (52) without electrical contact or connection with the detectors (52),
  - the checking means (72) comprising at least one conducting turn (74) surrounding an active end of a corresponding detector (52); and
  - means connected to the checking means for supplying the turn with current, activation of the means (78) for supplying the turn with current changing the state of the turn (74) from a first state to a second state, and deactivation of the means (78) for supplying the turn (74) with current changing the state of the turn from the second state to the first state.

12. A device for measuring a physical quantity associated with the rotation of a member (14), comprising:
- a metal disc (36) integral with the rotating member (14) and provided with a plurality of apertures (40) uniformly distributed over a circle centered on its axis, each of the apertures (40) forming a reference point,
- a fixed assembly (50) for detecting these reference points, comprising
  - a plurality of magnetic proximity detectors (52) uniformly distributed over a circular arc opposite the apertures (40), the dimensions and the angular spacings of the apertures (40) and of the detectors (52) being such that there is always a detector (52) opposite an aperture (40) whatever the angular position of the disc (36) with respect to the detection assembly (50), and
  - checking means (72) for checking that the detectors are operating correctly, the checking means being fitted outside the magnetic detectors (52) without electrical contact or connection with these detectors,
- wherein the checking means (72) comprises a conducting coil of several turns (74) surrounding an active end of a corresponding proximity detector (52) and is connected to a switch,
- the switch, when closed, changing the state of the conducting coil from a first state to a second state, and when opened, changing the state of the conducting coil from the second state to the first state.

* * * * *